United States Patent
Melanson et al.

(10) Patent No.: US 6,861,968 B2
(45) Date of Patent: Mar. 1, 2005

(54) SIGNAL PROCESSING SYSTEM WITH BASEBAND NOISE MODULATION AND NOISE FILTERING

(75) Inventors: John L. Melanson, Austin, TX (US); Stephen T. Hodapp, Austin, TX (US); Giri N. K. Rangan, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/668,397

(22) Filed: Sep. 23, 2003

(65) Prior Publication Data

US 2004/0140922 A1 Jul. 22, 2004

Related U.S. Application Data

(60) Provisional application No. 60/441,296, filed on Jan. 21, 2003.

(51) Int. Cl.[7] .................................................. H03M 3/00
(52) U.S. Cl. ....................... 341/143; 341/144; 341/118; 341/120; 375/247; 702/64
(58) Field of Search ................................ 341/143, 144, 341/118, 120

(56) References Cited

U.S. PATENT DOCUMENTS

| | | | |
|---|---|---|---|
| 4,939,516 A | | 7/1990 | Early .......................... 341/143 |
| 4,980,687 A | * | 12/1990 | Newell et al. ............... 341/157 |
| 5,039,989 A | | 8/1991 | Welland et al. ............. 341/143 |
| 5,150,121 A | * | 9/1992 | Newell et al. ............... 341/166 |
| 5,396,244 A | * | 3/1995 | Engel .......................... 341/143 |
| 5,500,645 A | * | 3/1996 | Ribner et al. ................ 341/143 |
| 5,727,024 A | * | 3/1998 | Hauptmann .................. 341/144 |
| 5,748,129 A | * | 5/1998 | Tsumura ...................... 341/120 |
| 6,147,634 A | * | 11/2000 | Rangan et al. ............... 341/143 |
| 6,271,781 B1 | * | 8/2001 | Pellon .......................... 341/143 |
| 6,449,569 B1 | * | 9/2002 | Melanson .................... 341/143 |
| 6,487,405 B1 | * | 11/2002 | Dapper ........................ 341/100 |
| 6,518,905 B2 | * | 2/2003 | Siferd .......................... 341/143 |

\* cited by examiner

*Primary Examiner*—Michael Tokar
*Assistant Examiner*—Lam T. Mai
(74) *Attorney, Agent, or Firm*—Hamilton & Terrile, LLP; Kent B. Chambers (57) ABSTRACT

A digital-to-analog converter ("DAC") system utilizes notch filters and chopping modulation technology to remove 1/f and other baseband noise from a baseband of a signal of interest. Chopping modulation and demodulation circuitry of the DAC operate at a chopping frequency and all harmonics equal to approximately one-half of a digital input signal sampling frequency. A notch filter attenuates signals having frequencies around the chopping frequency prior to chopping to reduce fold back of noise into the baseband due to parasitic modulation. Another notch filter attenuating signals having frequencies around twice the chopping frequency further reduces fold back of noise into the baseband.

24 Claims, 10 Drawing Sheets

SIGNAL PROCESSING SYSTEM WITH BASEBAND NOISE MODULATION AND NOISE FILTERING

CROSS-REFERENCE TO RELATED APPLICATION

This application claims the benefit under 35 U.S.C. §119 (e) of U.S. Provisional Application No. 60/441,296, filed Jan. 21, 2003 and entitled "Segmented Chopping Amplifier."

BACKGROUND OF THE INVENTION

1. Field of the Invention

The present invention relates in general to the field of signal processing, and, more specifically, to a system and method for modulating baseband noise and using filters to reduce noise in a baseband that occurs, in part, due to non-ideal system properties that mix noise into a baseband via fold back mechanisms.

2. Description of the Related Art

Many electronic systems employ signal processing technology to process analog, digital, or a mix of analog and digital signals. Components utilized to implement signal processing technology often generate unwanted noise. For example, digital-to-analog converters (hereinafter, "DAC") are widely utilized to convert digital signals into analog signals. In the process of conversion, DACs often generate noise through quantization errors ("quantization noise") and low frequency 1/f noise.

In audio applications, the digital to analog conversion process often involves oversampling a digital signal, modulating the signal using a delta-sigma modulator to shape noise associated with quantizing the digital signal, and performing a digital to analog conversion using a low-pass filter. The filtered output signal is generally amplified to produce an analog signal suitable for driving a load. Delta-sigma modulators receive an input signal and convert the signal into a series of binary pulses having an average amplitude over time proportional to the input signal. In the process of producing a modulated output signal, delta-sigma modulators introduce quantization noise into the modulated input signal. However, the quantization noise advantageously resides outside of the audio baseband where frequency components of interest reside, i.e. between about 0 Hz and above about 20–25 kHz. Nevertheless, some post modulation processing, such as a post-modulation digital to analog conversion and low pass filtering, introduces noise into the audio baseband.

One common type of noise generated in post modulation processing circuits, such as metal oxide semiconductor gain stages, is 1/f noise which, as the nomenclature implies, has relatively high energy at low frequencies that rapidly diminishes at higher frequencies. Analog filters often include one or more gain stages that introduce 1/f noise. A modulation technique referred to as "chopping" has been implemented in conventional technology to modulate 1/f noise out of the audio baseband.

Figure 1:
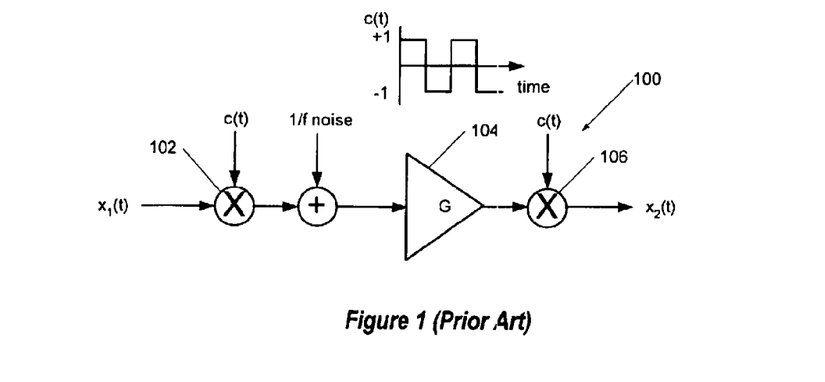
FIG. 1 (prior art) depicts an amplifier and chopping circuitry.
Figure 2A:
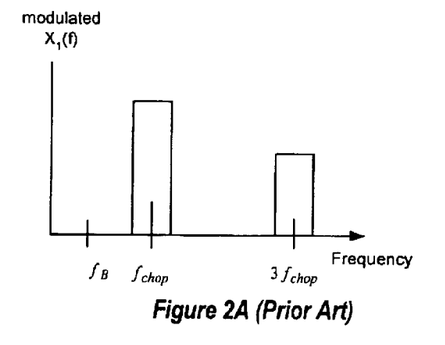
FIGS. 2A, 2B, and 2C depict signals associated with the amplifier and chopping circuitry of FIG. 1 in the frequency domain.

FIG. 1 depicts a chopping circuitry and amplifier 100, which is utilized as a component in many well-kmown circuits such as switched capacitor digital to analog converters. The input signal $x_1(t)$ is modulated by chopper circuit 102 at a frequency $f_{chop}$ for a chopper control signal c(t). FIG. 2A depicts modulated input signal $X_1(f)$ in the frequency domain, centered on $f_{chop}$, and harmonics of, $f_{chop}$. The amplitude of the modulated input signal $X_1(f)$ decreases with 1/n, where n is the harmonic number. The baseband of $X_1(f)$ extends to frequency $f_B$, which in audio applications is about 20–25 kHz. The 1/f noise is added to the modulated input signal $x_1(t)$ after chopping.

Figure 2B:
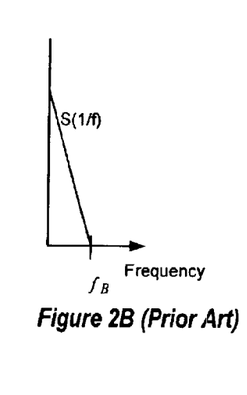

FIG. 2B illustrates the 1/f noise in the frequency domain. As mentioned above, the energy of the 1/f noise is primarily located within low frequencies, including the baseband of audio signals. Gain stage 104, which may be part of a larger circuit (not shown), such as a low pass filter, amplifies the modulated input signal $x_1(t)$ and 1/f noise.

Figure 2C:
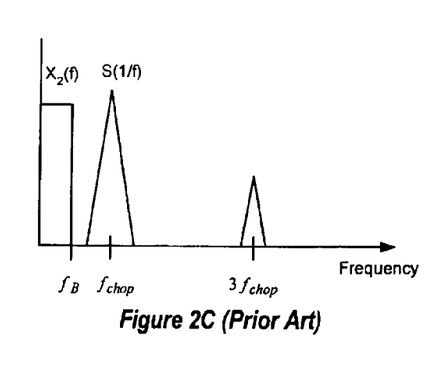

Chopper circuit 106 demodulates the output signal of gain stage 104 at the frequency of chopper signal c(t) to produce output signal $x_2(t)$. FIG. 2C depicts signal $x_2(t)$ and the 1/f noise signal in the frequency domain.

The demodulation of signal $x_1(t)$ moves the output signal of interest, $x_2(t)$, in the frequency domain back to the baseband and centers the 1/f noise at $f_{chop}$ and harmonics thereof, thus out of the baseband. In an audio application, a low pass filter (not shown) attenuates signals having frequency components of $x_2(t)$ outside $f_B$.

U.S. Pat. No. 4,939,516 issued Jul. 3, 1990 and entitled "Chopper Stabilized Delta-Sigma Analog-to-Digital Converter", Early et al inventors (hereinafter, "Early"), and U.S. Pat. No. 5,039,989 issued Aug. 13, 1991 and entitled "Delta-Sigma Analog-to-Digital Converter with Chopper Stabilization at the Sampling Frequency," Welland et al inventors (hereinafter, "Welland"), describe conventional applications of chopping in analog-to-digital converters (hereinafter "ADC"). Early and Welland proposed solutions using chopping circuitry to address 1/f and other noise issues that are particularly unique to ADCs.

Early proposed synchronizing a chopping frequency with an analog input signal sampling frequency and a digital filter. Early selected a chopping frequency equal to one-half of an analog input signal sampling frequency so that the chopping frequency would be in the rejection portion of the digital filter's frequency response. Early considered such synchronization to be important because the digital filter was able to provide a rejection of the 1/f noise that was modulated to the chopping frequency. See, for example, Early, col. 8, lns. 37–64.

Welland recognized that, in an ADC, choosing a chopping frequency equal to one-half of the sampling frequency of an analog input signal can actually increase the modulation of noise into an input signal's baseband. Thus, Welland selected a chopping frequency equal to the sampling frequency of the analog input signal. Welland included an analog modulator with at least one stage of amplification having a frequency response that provides a substantial amount of attenuation at the sampling frequency of the analog modulator in the Welland design. Thus, the amplification stage attenuates 1/f noise, which is shifted up in frequency by chopping to the sampling frequency.

DACs are in many ways very different from ADCS. Consequently, chopping frequencies of DACs are selected for different reasons than ADCs. Conventional technologies implement chopping in DACs at a chopping frequency that is as low as possible relative to a digital sampling frequency. The DAC chopping frequency is conventionally chosen just high enough to shift 1/f noise out of the baseband of the input signal in order to minimize parasitic effects associated with chopping circuitry.

Some DACs generate quantization noise, such as DACs that include a delta-sigma modulator and a switched capacitor DAC. The quantization noise associated with each bit can be significant enough to cause nonlinearity problems when the switched capacitor DAC receives the 1-bit and converts it into an analog signal. To address this problem, finite impulse response (FIR) filters receive the output bit of the delta-sigma modulator and produce attenuation bands, also referred to as "notches", in the frequency domain at various divisions of an input signal sampling frequency $f_S$. For example, notches placed at $f_S/n$, where "n" equals 16, 8, and 4, reduce quantization noise and thus minimize or eliminate nonlinear slewing of gain circuitry in the switched capacitor DAC. Embodiments of the switched capacitor DAC processing 1-bit from the delta-sigma modulator at a time also include chopping circuitry with a frequency $f_{chop}$ equal to $f_S/n$.

SUMMARY OF THE INVENTION

Chopping eliminates some noise within a signal's baseband but can also cause noise to add into the baseband. In embodiments of the present invention, notch filters include attenuation bands selected to attenuate noise that would otherwise be modulated into the baseband by chopping circuitry. In one embodiment of the present invention, a multi-bit digital to analog converter ("DAC") to (i) receive a digital input signal having a frequency attenuation band around a frequency $f_{chop}$, and (ii) convert the DAC input signal into a representative analog signal, the DAC includes a modulation circuit having a modulation frequency of $f_{chop}$ to modulate the DAC input signal by $f_{chop}$. The DAC further includes a gain stage coupled to the modulation circuit to receive signals modulated by the modulation circuit and provide gain for the DAC, wherein during operation the gain stage is associated with noise having frequencies within the baseband and a demodulation circuit, coupled to the gain stage and having a demodulation frequency equal to approximately or equal to $f_{chop}$, to demodulate signals by approximately or equal to $f_{chop}$. The system further includes a notch filter to generate the frequency attenuation band around the frequency $f_{chop}$, to reduce introduction of noise into a frequency baseband of the digital input signal. In another embodiment, the system further includes a notch filter to generate a frequency attenuation band around the frequency $2f_{chop}$ to further reduce introduction of noise into the frequency baseband of the digital input signal.

In another embodiment of the present invention, a method to attenuate chopping noise of a digital to analog converter within a frequency baseband of an input signal, wherein the chopping noise is associated with a chopping circuit having a chopping frequency $f_{chop}$ includes attenuating noise signal components of an input signal modulated by a multi-bit digital to analog converter prior to chopping over an attenuation band at least equal to the baseband of the input signal and centered at $f_{chop}$, wherein $f_{chop}$ is greater than a highest frequency of the baseband of the input signal.

In another embodiment of the present invention, a method to attenuate chopping noise of a digital to analog converter within a frequency baseband of an input signal, wherein the chopping noise is associated with a chopping circuit having a chopping frequency of $f_{chop}$ includes attenuating noise signal components of a digital input signal within a loop of a delta-sigma modulator prior to chopping over an attenuation band at least equal to the baseband of the input signal and centered at $f_{chop}$, wherein $f_{chop}$ is greater than a highest frequency of the baseband of the input signal to reduce introduction of noise into a frequency baseband of the digital input signal.

In another embodiment of the present invention, an audio system includes a digital audio signal source and a digital to analog converter ("DAC") to (i) receive a digital input signal from the digital audio signal source having a frequency attenuation band around a frequency $f_{chop}$, and (ii) convert the DAC input signal into a representative analog signal. The DAC includes a delta-sigma modulator having a notch filter within the delta-sigmna modulator to generate the frequency attenuation band around the frequency $f_{chop}$ to reduce introduction of noise into a frequency baseband of the digital input signal and a modulation circuit having a modulation frequency of $f_{chop}$ to modulate the DAC input signal by $f_{chop}$. The DAC further includes a gain stage coupled to the first modulation circuit to receive signals modulated by the modulation circuit and provide gain for the DAC, wherein during operation the gain stage is associated with noise having frequencies within the baseband and a demodulation circuit, coupled to the gain stage and having a demodulation frequency equal to approximately or equal to $f_{chop}$, to demodulate signals by approximately or equal to $f_{chop}$. The audio system also includes an amplifier coupled to the DAC and an audio output device coupled to the DAC.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Signal processing technology operates on analog, digital and mixed signals (analog and digital). For example, audio signals, representing a signal of interest and having frequency components residing within a baseband, begin as analog signals and are often digitized through sampling and converted back into analog output signals using digital-to-analog converters (DACs). Audio frequency analog output signals produce sound through a loud speaker, headphones, or other output device.

High performance digital signal processing systems, described in more detail below, are particularly sensitive to noise, even low levels of noise. In one embodiment, to address such noise concerns, a digital to analog converter ("DAC") includes chopping circuitry. Non-ideal circuit properties can cause parasitic modulation of noise into the baseband of the signal of interest. For example, chopping circuitry often produces parasitic signals that result in the fold back of such noise into a baseband of a digital input signal due to modulation caused by non-ideal properties of the digital signal processing systems. Systems such as delta sigma modulators generate high levels of noise outside the baseband called quantization noise. The folding back of this noise into the baseband due to parasitic modulation can be very detrimental to the quality of the baseband signal, which is the signal of interest. This fold back of noise is a concern having no counterpart in conventional analog to digital converter technology.

A digital signal processing system that includes a DAC with chopping circuitry also includes attenuation bands to prevent parasitic modulation of noise into the baseband. Notch filters attenuate noise in an input signal to the DAC to prevent the parasitic modulation of noise into the baseband. As described in more detail below, parasitic modulation can occur at a variety of frequencies, such as the chopping frequency $f_{chop}$ and $2f_{chop}$ and harmonics of both. In one embodiment, the digital signal processing system includes a delta-sigma modulator and the notch filters, with attenuation bands at frequencies $f_{chop}$ and $2f_{chop}$ and harmonics of both, which are inserted in parallel with a main loop filter of the delta-sigma modulator. In another embodiment, notch filters filter the output signal of the delta-signa modulator with attenuation bands at frequencies $f_{chop}$ and $2f_{chop}$ and harmonics of both and provide the filtered delta-sigma modulated output signal as an input signal to a multi-bit DAC. The multi-bit DAC does not suffer from non-linearity concerns caused by excessive quantization noise. The notch filters insert zeros into the frequency response of the DAC at frequencies $f_{chop}$ and $2f_{chop}$ and harmonics of both. Each attenuation band is preferably designed to have an attenuation band at least equal to the baseband of an input signal of interest but may be greater or smaller depending on design factors such as the level of noise and/or quality desired for the signal of interest.

Figure 3:
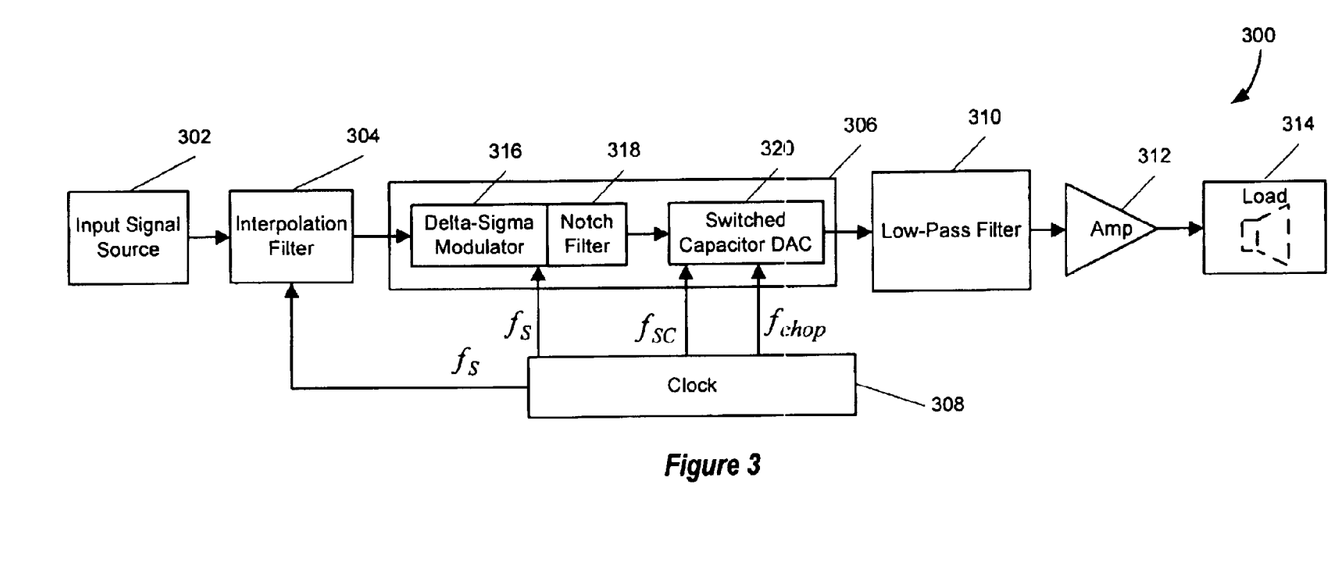
FIG. 3 depicts a digital signal processing system that includes a digital to analog converter with chopping circuitry operating at a chopping frequency of $f_{chop}$ and a loop notch filter within a delta sigma modulator.

FIG. 3 depicts digital signal processing system 300. Digital signal processing system 300 represents one embodiment of a system that includes a notch filter in parallel with the main loop filter of a delta-sigma modulator to attenuate noise at frequencies that are subject to fold back into the baseband by parasitic modulation. Digital signal processing system 300 is an audio system for receiving, processing, and providing audio output signals. Input signal source 302 provides a digital input signal from any signal source, such as a compact disk player, MP3 player, audio/video system, or other audio recording and/or playback device. An interpolation filter 304 performs oversampling operations in a well-known manner on the digital input signal received from the input signal source 302. The interpolation filter 304 has an output sampling frequency, $f_S$, provided by clock 308. The modulator—DAC 306 processes the interpolated digital input signal to convert the digital input signal into an analog signal. The modulator—DAC 306 includes a delta-sigma modulator 316 with a notch filter 318 inserted in parallel with the main loop filter of the delta-sigma modulator 316. The notch filter 318 includes attenuation bands that are around the out-of-baseband frequencies that are subject to parasitic modulation into the baseband. The baseband is the frequency range that contains frequencies of a signal of interest. For example, in an audio system, the baseband is approximately 0 to 25 kHz, which represents the frequencies audible to the human ear. Parasitic modulation occurs at frequencies $f_{chop}$, $2f_{chop}$ and harmonics of both. Thus, notch filter 318 attenuates signals with frequencies around the frequencies $f_{chop}$, $2f_{chop}$, and harmonics of both. The attenuation bands of notch filter 318 center respectively on frequencies $f_{chop}$, $2f_{chop}$, and harmonics of both, and each attenuation band has an attenuation bandwidth of +/− the baseband frequency $f_B$. As described in more detail below, an attenuation bandwidth of $+/-f_B$ reduces or prevents parasitic modulation of noise into the baseband.

The delta-sigma modulator 316 provides a series of multi-bit output signals to switched capacitor DAC 320. In another embodiment, the delta-sigma modulator 316 with a parallel, loop notch filter is a 1-bit delta-sigma modulator. The output signals of the delta-sigma modulator 316 have an average value over a predetermined time equal to the digital input signal plus quantization error. "Delta-sigma modulator" and "sigma-delta modulator" are common, interchangeable terms for purposes of this specification. The delta-sigma modulator is clocked at a frequency $f_S$. The frequency $f_S$ is selected based upon the particular application of digital signal processing system 300. For example, in audio applications, frequency $f_S$ is 6.144 MHz, which reflects a 128 bit word representation of an audio signal originally sampled at 48 kHz. The frequency spectrum of the quantization noise generated by delta-sigma modulator 316 resides primarily outside of an audio frequency baseband. The quantization noise represents one example of noise that has frequency components that can fold back and mix with a signal of interest in the baseband when using conventional technology.

The modulator—DAC 306 also includes chopping circuitry to modulate noise, such as 1/f noise out of a baseband of the input signal. Clock 308 provides various control signals to modulator—DAC 306 as described below. In general, clock 308 provides a clock signal having a frequency of $f_S$ to modulator—DAC 306 and provides various chopping signals that have a frequency $f_{chop}$. Example values for $f_{chop}$ are described in more detail in more detail in commonly assigned, pending patent application entitled "Signal Processing System with Baseband Noise Modulation and Noise Fold Back Reduction", inventors Marjorie R. Plisch, John L. Melanson, Stephen T. Hodapp, and Giri N. K. Rangan, attorney docket number 1411-CA and having the same filing date as the present application (referred to herein as the "Plisch Application"). The Plisch Application is hereby incorporated by reference in its entirety.

A low pass filter 310, generally having a corner frequency at or above the baseband frequency, $f_B$, of the baseband of the input signal, attenuates output signal frequency components outside the baseband. A filtered output signal from the low pass filter 310 is generally amplified before being provided to load 314, especially when driving a low impedance load. Thus, amplifier 312 amplifies the filtered output signal and provides the signal to load 314. Although load 314 may be any load, in audio applications, load 314 represents, for example, loud speakers, headphones, and other sound producing devices.

Figure 4:
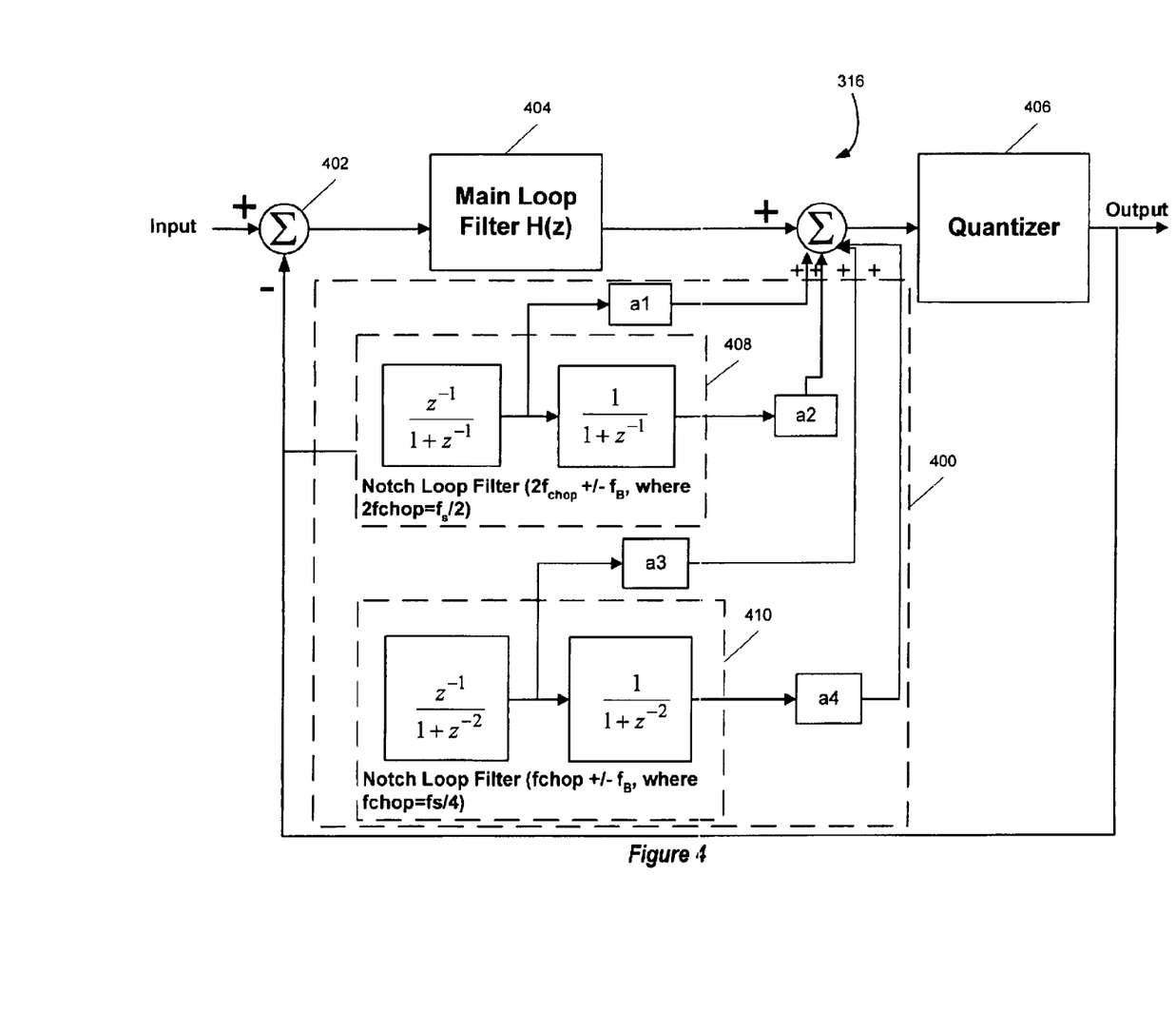
FIG. 4 depicts an embodiment of the delta-sigma modulator of FIG. 3 and the notch filters.

Referring to FIGS. 3 and 4, the notch filter 400 represents one embodiment of notch filter 318. The delta-sigma modulator 316 includes a conventional summing node 402 to sum a received input signal and negative feedback input from the quantizer 406. The delta-sigma modulator 316 also includes a first order main loop filter H(z) 404 for noise shaping. The main loop filter H(z) 404 is modified by adding parallel notch loop filter 400. The notch loop filter 400 has transfer functions $z^{-1}/(1+z^{-1})$ with gain a1 for stability and $1/(1+z^{-1})$ with gain a2 for stability. Coefficients of the notch filter 400 are dependent on the specific application of digital signal processing system 300 and are determined in a well-known manner to provide attenuation of frequency components within frequencies $2f_{chop}+/-f_B$ and harmonics when $2f_{chop}=f_S/2$. The notch loop filter 410 has transfer functions $z^{-1}/(1+z^{-2})$ with gain a3 and $1(1+z^{-2})$ with gain a4. Coefficients and gains of the notch filter 400 are dependent on the specific application of digital signal processing system 300 and are determined in a well-known manner to provide attenuation of frequency components within a frequency band of $f_{chop}+/-f_B$ and harmonics and a frequency band of $2f_{chop}+/-f_B$ and harmonics when $f_{chop}=f_S/4$. As described in more detail below, during chopping parasitic noise is generated around frequency $f_{chop}$, $2f_{chop}$, and harmonics, thereof as a result of, for example, non-ideal properties of switched capacitor DAC 320. Thus, frequencies within the frequency bands of $f_{chop}+/-f_B$ and harmonics and a frequency band of $2f_{chop}+/-f_B$ and harmonics can be parasitically modulated into the baseband. By attenuating frequencies in these bands, parasitic modulation of noise, such as quantization noise, into the baseband is reduced or prevented, depending on the degree of attenuation.

Figure 5:
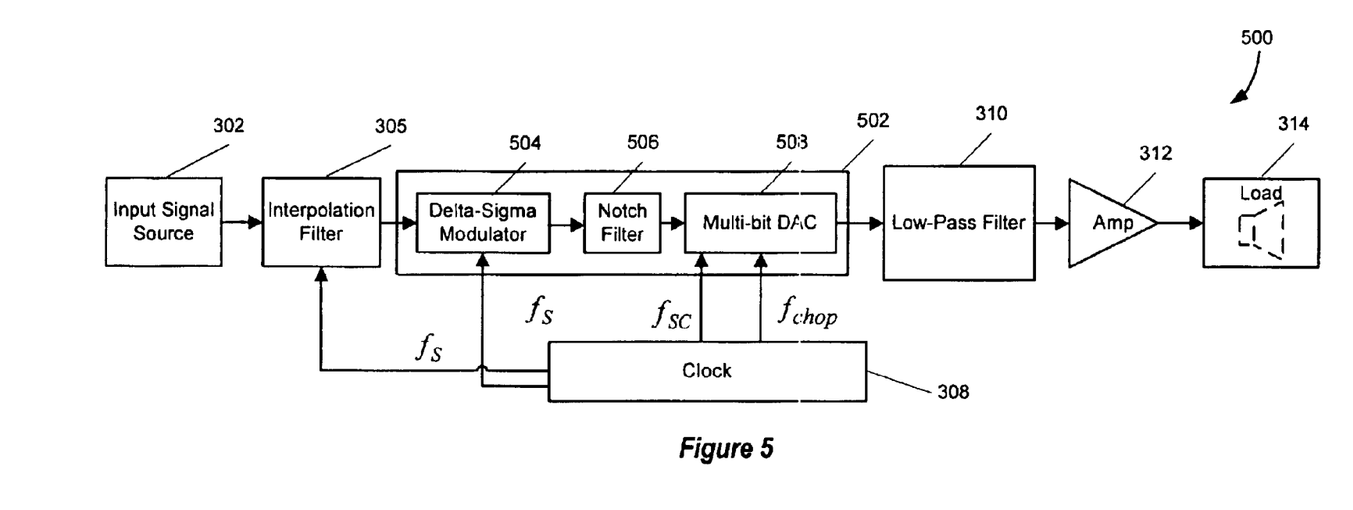
FIG. 5 depicts a digital signal processing system that includes a delta-sigma modulator, a notch filter to filter the output of the delta-sigma modulator, and a multi-bit digital to analog converter with chopping circuitry operating at a chopping frequency of $f_{chop}$.

FIG. 5 depicts a digital signal processing system 500 that includes modulator—DAC 502 and delta-sigma modulator 504. Delta-sigma modulator 504 is, in one embodiment, identical to delta-sigma modulator 316 without the notch filter 318. Instead, a separate notch filter 506 attenuates frequency bands in the output signal of the delta-sigma modulator 504 and provides a filtered output signal to the multi-bit DAC 508. As with notch filter 318, notch filter 506 includes attenuation bands at out-of-baseband frequencies that are subject to parasitic modulation into the baseband. The notch filter 506 filters an output signal of the delta-sigma modulator 504 and provides an output signal to the multi-bit DAC 508. Parasitic modulation occurs at frequencies $f_{chop}$, $2f_{chop}$, and harmonics of both. Thus, notch filter 506 attenuates signals with frequencies around $f_{chop}$, $2f_{chop}$, and harmonics of both. In one embodiment, the attenuation bands of the notch filter 506 center respectively on frequencies $f_{chop}$, $2f_{chop}$, and harmonics of both, and each attenuation band has an attenuation bandwidth of +/- the baseband frequency $f_B$. As described in more detail below, an attenuation bandwidth of $+/-f_B$ reduces or prevents parasitic modulation of noise into the baseband.

Figure 6:
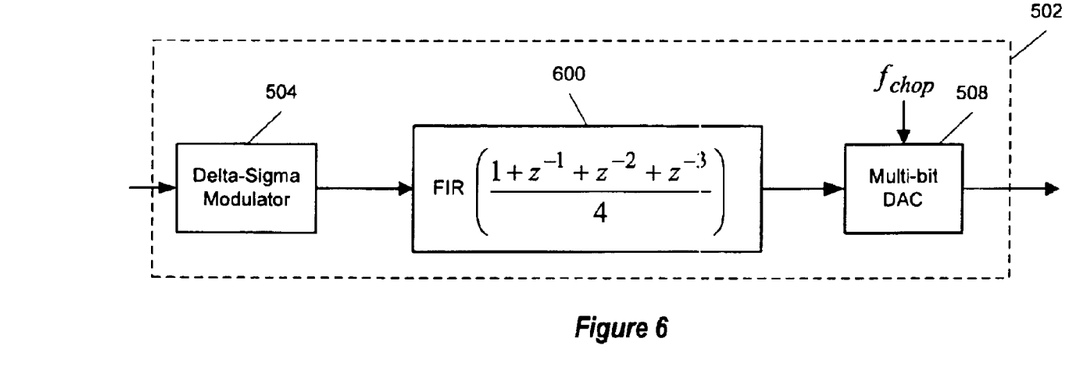
FIG. 6 depicts the digital processing system of FIG. 5 with a post-modulation, pre-DAC digital notch filter.

FIG. 6 depicts modulator—DAC 502 with the notch filter 506 implemented as a 4-tap finite impulse response (FIR) boxcar filter 600. FIR filter 600 has a transfer function of $(1+z^{-1}+z^{-2}+z^{-3})/4$ that provides two notches, one centered at $f_S/4$ and the other centered at $f_S/2$. If the chopping frequency is set at $f_S/4$, the two notches of FIR filter 600 attenuate signals with frequencies around $f_{chop}$ and $2f_{chop}$. Coefficients of notch FIR filter 600 are also dependent on the specific application of digital signal processing system 300 and are determined in a well-known manner to, for example, provide attenuation of signal frequency components within the attenuation bands of $f_{chop}+/-f_B$ and harmonics thereof and $2f_{chop}+/-f_B$ and harmonics thereof, It will be recognized by those of ordinary skill in the art that other notch filter embodiments, including continuous time notch filters, can be used to achieve attenuation signals with frequencies parasitically modulated into a baseband. Thus, notch filters 318 and 506 attenuate signals at frequencies $f_{chop}+/-f_B$ and harmonics thereof and $2f_{chop}+/-f_B$ and harmonics thereof that would otherwise fold back into the baseband and mix with a signal of interest due to parasitic modulation at $f_{chop}+/-f_B$ and harmonics thereof.

Figure 7:
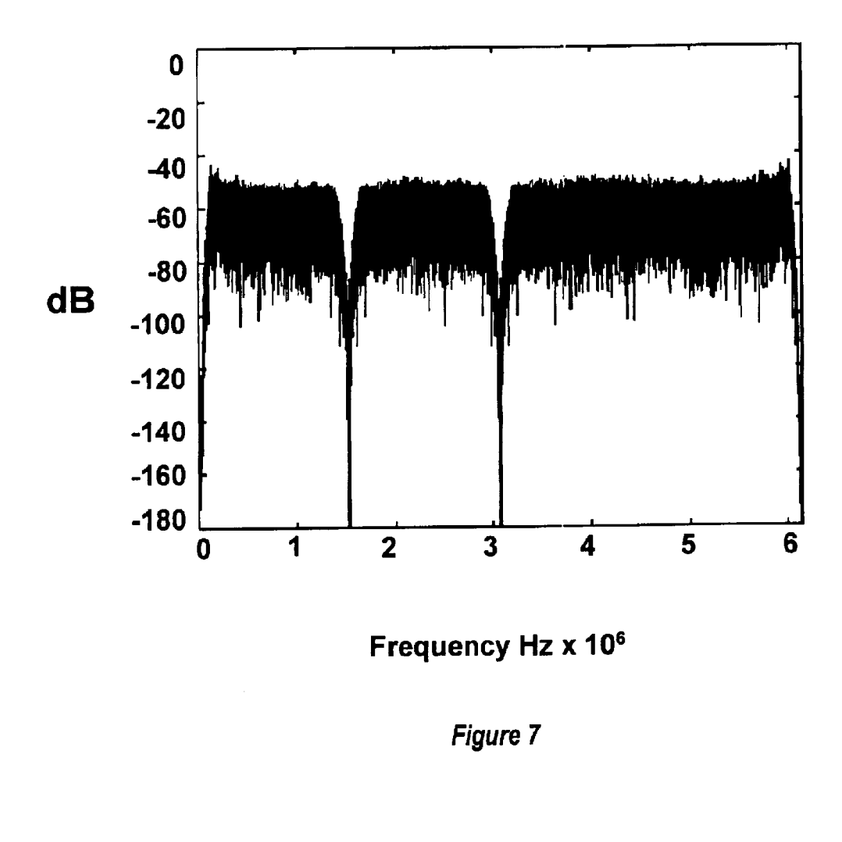
FIG. 7 depicts a frequency response of the notch filters of FIGS. 4 and 6.

FIG. 7 depicts an actual frequency spectrum plot of one embodiment of notch filter 318 and notch filter 506 in an audio application, where $f_S$=6.144 MHz, $f_B$=25 kHz, and $f_{chop}=f_S/2$.

Figure 8:
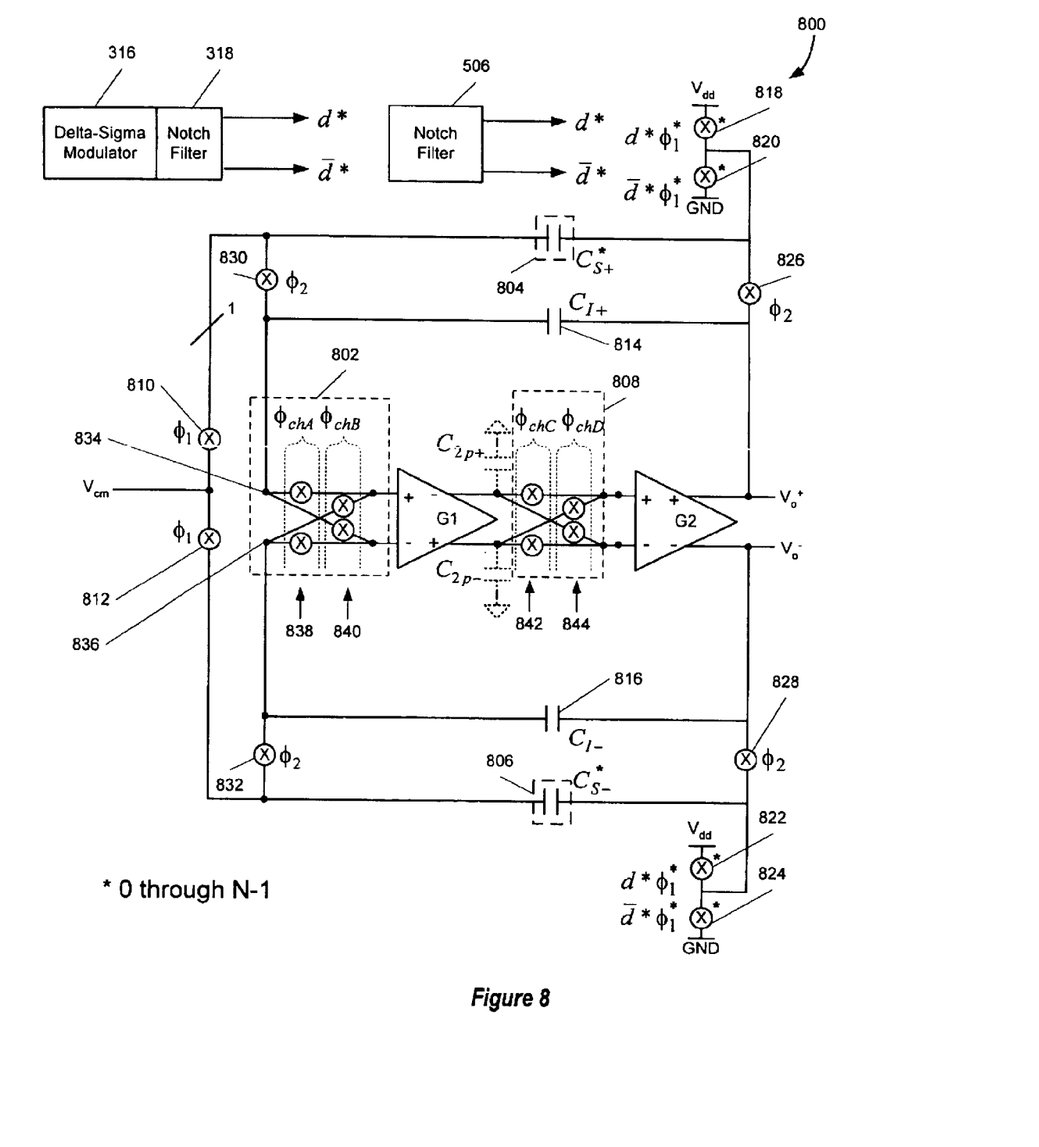
FIG. 8 depicts an embodiment of the switched capacitor digital to analog converter of FIGS. 3 and 5.
Figure 9:
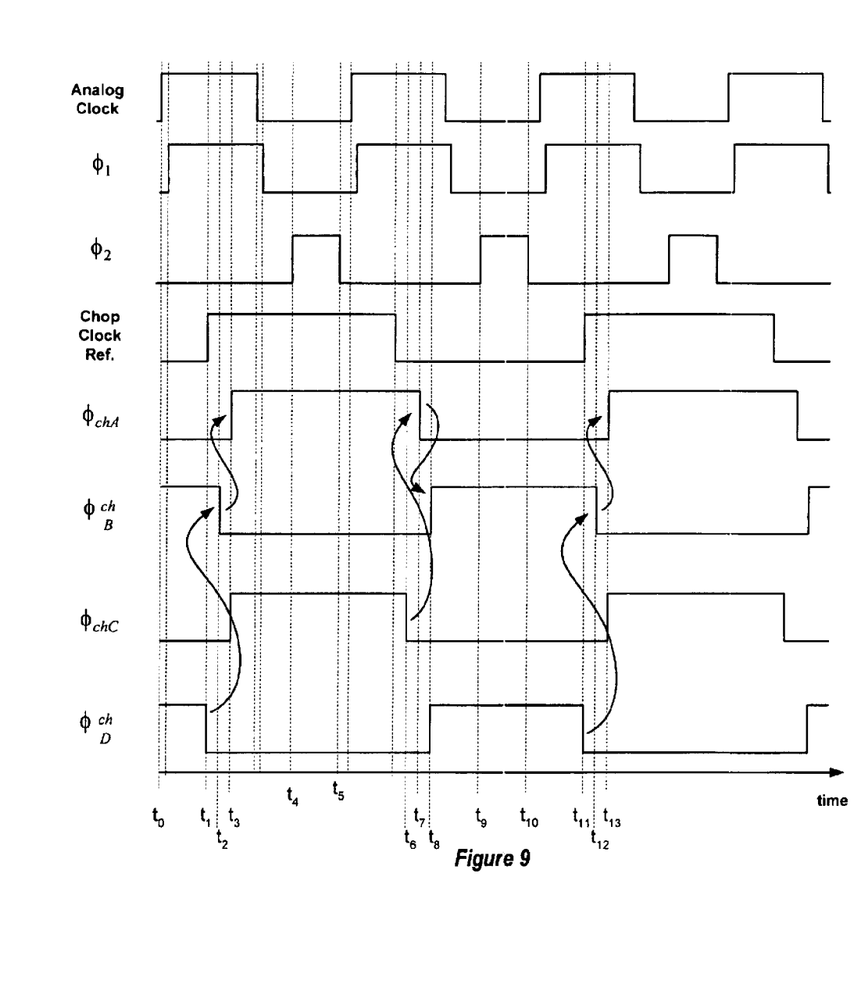
FIG. 9 depicts clock and control signals associated with the switched capacitor digital to analog converter of FIGS. 3 and 5.

FIG. 8 depicts a switched capacitor DAC 800, which is one embodiment of switched capacitor DACs 320 and 508. Switched capacitor DAC 800 includes modulating chopping circuitry 802, which modulates the input signal provided by delta-sigma modulator 316 and, in another embodiment, by notch filter 506. Switched capacitor DAC 800 includes demodulating chopping circuitry 808, which demodulates the output signal of gain stage G1. The symbol "d*" represents the logical "1" or "0" output of delta-sigma modulator 316 and notch filter 506. The symbol "$\overline{d}$*" represents the complement of "d*". In one embodiment, switched capacitor DAC 800 is a multi-bit DAC and processes N input bits during each clock cycle. Each clock cycle is divided into several non-overlapping phases denoted as $\phi_1$, $\phi_2$, etc. as depicted in FIG. 9. The "*" represents the ith bit, where $0 \leq i \leq N-1$.

Many well-known hardware, software, and hardware-software combinations can be used to provide an input signal to switched capacitor DAC 800 that corresponds to "d*" and "$\overline{d}$*". Capacitor banks 804 and 806 each contain an identical number of "N" parallel coupled, corresponding sampling capacitors, collectively referred to as $C_S+$ (804) and $C_S-$ (806). Each sampling capacitor in capacitor bank 804 is charged in accordance "d*" and "$\overline{d}$*" with one-bit of each N-bit word in the output of delta-sigma modulator 316 or notch filter 506. The same charging scheme applies to capacitor bank 806. Capacitors associated with the same bit within capacitor banks 804 and 806 are referred to herein as "corresponding capacitors".

The switched capacitor DAC 800 operates in accordance with the control signals depicted in FIG. 9. In this embodiment, all of the control signals are generated with reference to an analog clock signal. The control signals, including chopping circuitry control signals, are preferably phase-shifted relative to the analog clock signal and relative to each other to allow settling of components and to minimize the inclusion of switching noise into the signal being processed. Settling time is dependent upon specific component value and other design considerations well-known to those of ordinary skill in the art. As will be described in more detail below, it has been identified that while the inclusion of chopping circuitry 802 and 808 addresses some low frequency noise concerns (e.g. 1/f noise) within the baseband, a concern arises due to potential fold back into the baseband of noise, such as quantization noise and consequential corruption of the signal of interest due to parasitic modulation at frequencies $f_{chop}$ and harmonics thereof and frequencies $2f_{chop}$ and harmonics thereof.

The operation of switched capacitor DAC 800 is now described in conjunction with the control signals depicted in FIG. 9. Beginning at time t0, alter the analog clock rises and a sufficient time has been allocated to allow circuits to settle, control signal $\phi_1$ rises for a sufficient time to cause switches 810 and 812 to conduct and short one plate of $C_{S+}$ 804 and $C_{S-}$ 806 sampling capacitors to the common mode voltage Vcm. The sampling capacitors $C_{S+}$ 804 and $C_{S-}$ 806 are charged to Vdd through respective switches 818 and 822 or discharged to ground GND, in accordance with the value of d* and $\bar{d}$* associated with each sampling capacitor, through respective switches 820 and 824 while control signal $\phi_1$ is HIGH. Each of switches 818, 820, 822, and 824 represent N respective switches, one for each of the N bits in the delta sigma modulator 404 N-bit output word, where N is, for example, 4, 8, 16, etc.

After sampling capacitors $C_{S+}$ 804 and $C_{S-}$ 806 are charged in accordance with the modulated output signal of delta sigma modulator 504, control signal $\phi_2$ causes switches 826, 828, 830 and 832 to conduct and transfer charge to integrating capacitors $C_{1+}$ 814 and $C_{1-}$ 816.

The operational phases of switched capacitor DAC 800 are summarized in Table 1:

TABLE 1

| Control Signal ID and State* | Switched Capacitor DAC 800 Operational Phase |
|---|---|
| $\phi_1$ - HIGH | Charge |
| $\phi_2$ - HIGH | Dump |

* "HIGH" represents a conduction control state and "LOW" represents a non-conduction control state. The polarities can be reversed in other embodiments.

Chopping circuitry 802 modulates the DAC input signal at input terminals 834 and 836 and chopping circuitry 808 demodulates the output signal of gain stage G1. The chopping modulation and demodulation operations are summarized in Table 2:

TABLE 2

| Chopping Circuitry | Chopping Circuitry Operational Phase |
|---|---|
| Chopping Circuitry 802 | Modulation |
| Chopping Circuitry 808 | Demodulation |

Referring to FIGS. 8 and 9, control signals $\phi_{chA}$ and $\phi_{chB}$ of chopping circuitry 802 are non-overlapping to prevent signal corruption, preferably square waves (or approximations thereto), and control conduction of switches 838 and 840, respectively. Chopping circuitry 808 control signals $\phi_{chC}$ and $\phi_{chD}$ are also non-overlapping to prevent signal corruption, preferably square waves (or approximations thereto), and control conduction of switches 842 and 844, respectively. A rise of control signal $\phi_{chA}$ at time $t_3$ causes direct switches 838 to conduct and pass-through the delta-sigma modulated input signal at input terminals 834 and 836 straight to gain stage G1 during the first depicted Dump phase occurring from $t_4$ to $t_5$. Direct switches 842 also conduct at time $t_3$, and, during the first Dump phase, gain stage G1 passes through an amplified output signal straight to the input terminals of gain stage G2. Control signal $\phi_{chC}$ falls at $t_6$ followed by the fall $\phi_{chA}$ at $t_7$. The delay between turning direct switches 842 "off" (nonconducting) and turning direct switches 838 off at the input of gain stage G1 is set by control signals $\phi_{chC}$ and $\phi_{chA}$ to provide a delay sufficient to prevent the switching noise associated with switches 838 from being passed through to the outputs $V_o+$ and $V_o-$. The delay time depends on the particular implementation of the DAC and chopping circuitry. In one embodiment, the delay is on the order of 8 ns. Conduction and nonconduction of switches 838, 840, 842, and 844 are controlled by the edge of control signals or controlled by other properties of the control signals in a well-known manner.

At time $t_8$ prior to the beginning of the second depicted Dump phase ($t_9$ through $t_{10}$), a rise of cross-over control signals $\phi_{chB}$ following the fall of $\phi_{chA}$ causes cross-over switches 840 to conduct. The delta-sigma modulated input signal at input terminals 834 and 836 cross-over to opposite inputs of gain stage G1 during the second Dump phase. Control signal $\phi_{chD}$ falls at $t_{11}$ followed by the fall of $\phi_{chB}$ at $t_{12}$ again with a delay sufficient to prevent the switching noise associated with switches 840 from being passed through to the outputs $V_o+$ and $V_o-$. When cross-over switches 844 conduct beginning at $t_8$, gain stage G1 provides an amplified output signal crossed-over to the input terminals of gain stage G2. The demodulation phase of chopping circuit 808 ends at time $t_{12}$. At time $t_{13}$, control signal $\phi_{chA}$ rises again, and the processes described above occurring between $t_3$ and $t_{12}$ repeat during operation of switched capacitor DAC 800. The timing of control signals $\phi_{chA}$, $\phi_{chB}$, $\phi_{chC}$, and $\phi_{chD}$ are achieved by using the chop clock reference signal as a reference and using delay elements to achieve the desired timing.

"$V_o+$" and "$V_o-$" represent the respective differential output signals of the switched capacitor DAC 800. Gain stages G1 and G2 are dual output, fully differential operational amplifiers, which can be of any design suitable for the application to which they are applied. Other gain stage implementations may be used. Other embodiments of switched capacitor DAC 800 use a single gain stage or more than two gain stages.

Figure 10:
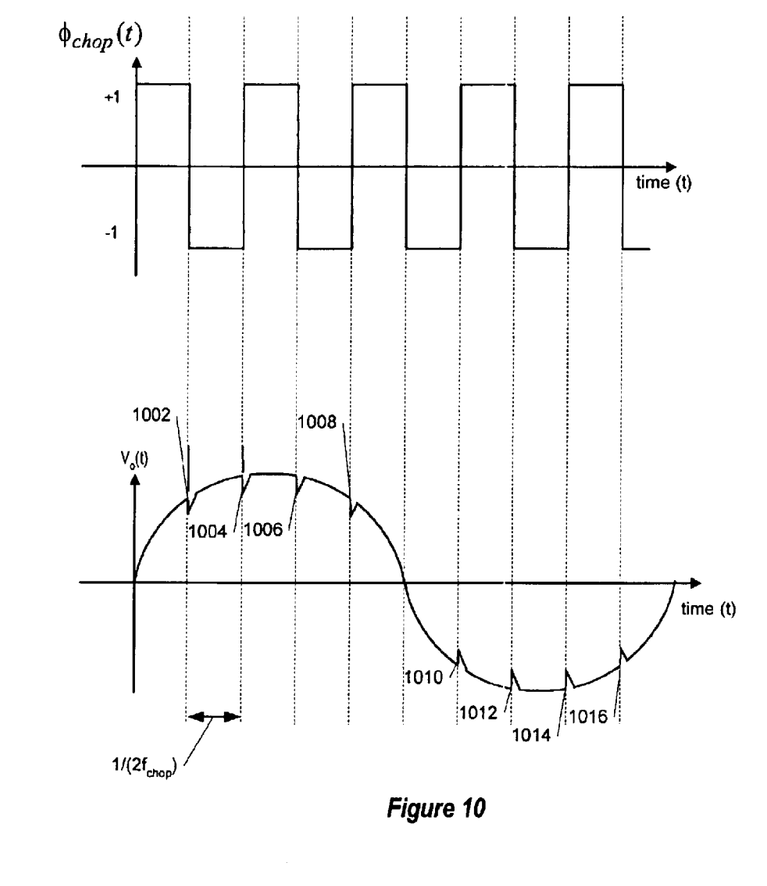
FIG. 10 depicts glitches at $2f_{chop}$ associated with the switched capacitor digital to analog converter of FIG. 9.

DACs often contain non-ideal properties such as parasitic capacitances or timing errors. Such non-ideal properties can produce parasitic modulation, which can corrupt a signal of interest due to, for example, fold back of noise into the baseband and adding to the signal of interest. This type of noise foldback into the baseband can reduce the quality or signal to noise ratio (SNR) of the signal of interest. For example, the chopping circuitry 802 and 808 in association with various parasitic capacitances as well as other non-ideal properties can cause noise to occur at frequencies $f_{chop}$ and harmonics of $f_{chop}$ and $2f_{chop}$ and harmonics of $2f_{chop}$. For example, referring to FIG. 10, parasitic capacitors $C_{2p+}$ and $C_{2p-}$ cause continuous time glitches 1002–1016 to occur at the output of switched capacitor DAC 800 at a frequency of $2f_{chop}$. The parasitic modulation caused by the glitches 1002–1016 results in fold back into the baseband of signals at $2f_{chop}$ and harmonics thereof. Additionally, parasitic modulation at frequency $f_{chop}$ and harmonics thereof has been observed to cause fold back of signals at $f_{chop}$, the signal of interest is folded back onto itself. Gain stage G2 also introduces l/f noise. However, if the gain of gain stage G1 is relatively high, the energy level of the gain stage G2 l/f noise is relatively low.

Figure 11:
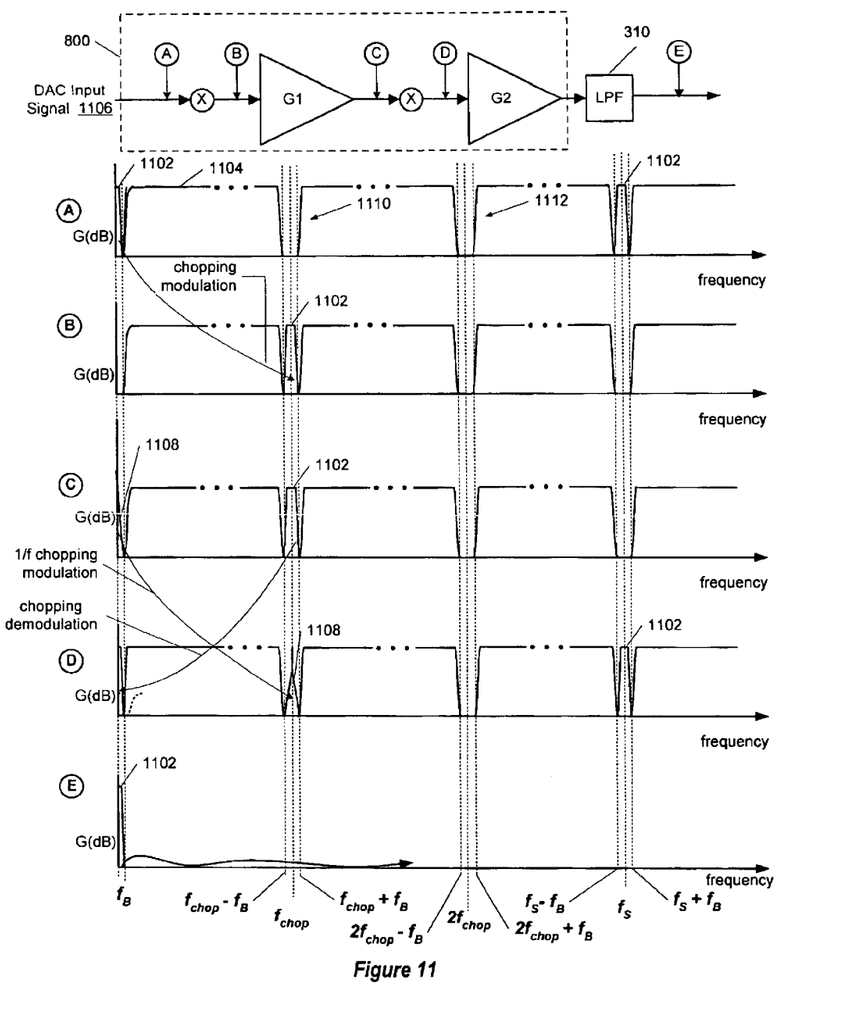
FIG. 11 depicts a frequency response of the switched capacitor digital to analog converter of the system of FIGS. 3 and 5 at various points of reference.

FIG. 11 depicts the frequency response of switched capacitor DAC 800 and low pass filter 310 at various points of reference. FIG. 11 is not drawn to scale so as to better depict particular items of interest. The frequency axis and amplitudes are not to scale, and the depiction of switched capacitor DAC 800 has been simplified to highlight points of reference in the frequency domain. Also, for clarity, FIG. 11 only depicts positive frequencies, and harmonics are not shown but are affected in the same way as their ftmdamental frequencies. It is understood that a mirror image of the frequency spectrums in FIGS. 11 and 12 reside at negative frequencies. In an audio application embodiment, the baseband of the input signal of interest from input signal source 302 has a bandwidth ranging from 0 Hz to $f_B$, where $f_B$ is about 28 kHz. At reference point A, frequency components of the input signal 1102 from the input signal source 302 reside within the baseband. The DAC input signal 1106 received at input terminals 834 and 836 includes the input signal 1102 and the quantization noise 1104. Attenuation bands 1110 and 1112, created by filtering the quantization noise 1104 either with the delta-sigma modulator 316 and notch filter 318 or the delta-sigma modulator 504 and notch filter 506, respectively, reside at frequencies $f_{chop}+/-f_B$ and harmonics of $f_{chop}$ and $2f_{chop}+/-f_B$ and harmonics of $2f_{chop}$. Frequency $f_{chop}=f_S4$, in the embodiment of FIG. 11. The frequency components of the quantization noise 1104 generated by the delta-sigma modulator 316 or delta-sigma modulator 504 reside between frequencies $f_B$ and $f_S$ minus $f_B$ except for within attenuation bands 1110 and 1112. The spectrum is repeated at $f_S$ and integer multiples offs in accordance with digital sampling theory.

Referring to reference point B, chopping circuit 802 modulates the DAC input signal 1106 at reference point A by frequency $f_{chop}$, thereby transposing the frequency spectrum at reference point A up by frequency $f_{chop}$. Thus, the delta-sigma modulated input signal 1102 now resides within frequencies $f_{chop}+/-f_B$ with a mirror image $f_{chop}-f_B$ and $f_{chop}$ and some quantization noise 1104 resides within the baseband. The 1/f noise 1108, with higher energy levels in the baseband, is introduced and shown at reference point C. Chopping circuit 808 demodulates the signal at reference point C, thereby transposing the frequency spectrum down by $f_{chop}$ as depicted at reference point D. Thus, the modulated input signal 1102 (the signal of interest) is transposed back to the baseband. During the chopping demodulation stage, the 1/f noise is modulated by $f_{chop}$, thereby transposing the 1/f noise frequency components up by $f_{chop}$ as depicted at reference point D.

The attenuation of quantization noise 1104 in attenuation bands 1110 and 1112 reduces or prevents fold back of quantization noise 1104 into the baseband due to parasitic modulation at $f_{chop}$ and $2f_{chop}$. Thus, the attenuation bands 1110 and 1112 reduce or prevent corruption of the signal of interest, input signal 1106, by quantization noise. The low pass filter 310 attenuates frequency components in the output of gain stage G2 as depicted at reference point E.

Figure 12:
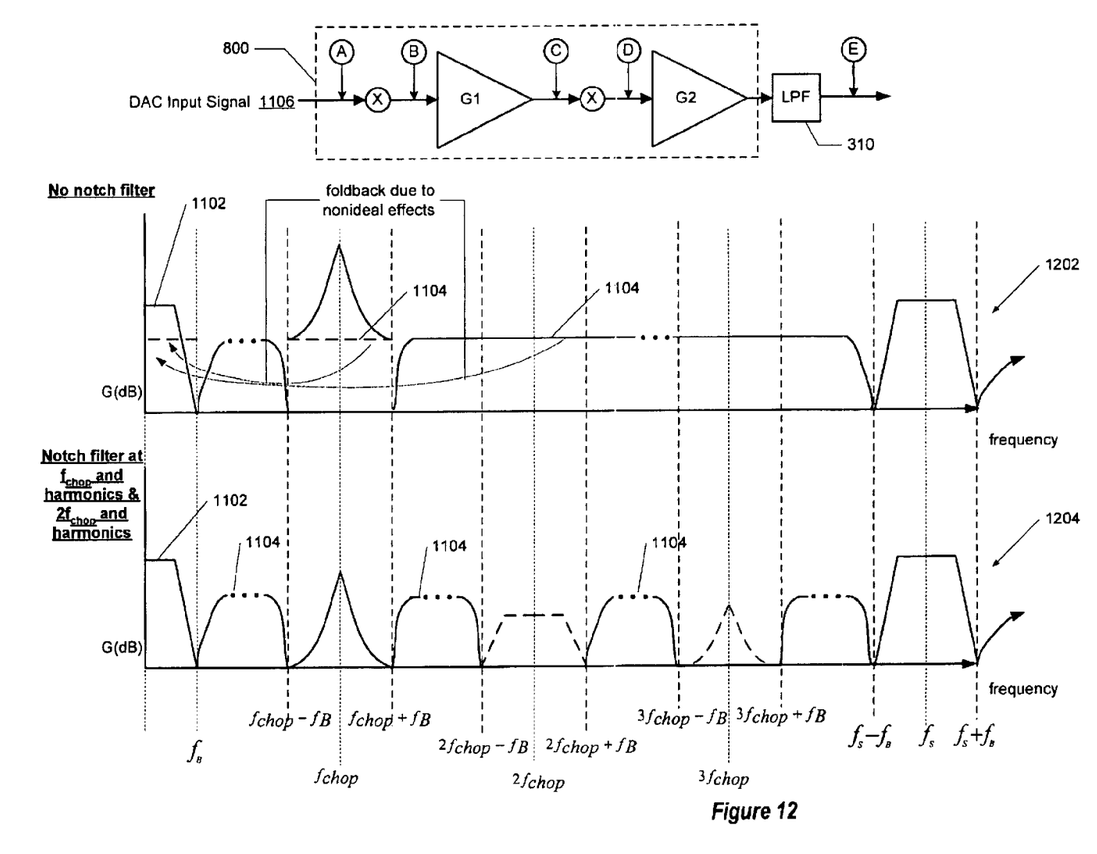
FIG. 12 depicts a frequency response at the output of the switched capacitor digital to analog converter of the system of FIGS. 3 and 5 with and without notch filtering.

FIG. 12 depicts at various points of reference the frequency response of switched capacitor DAC 800 in conjunction with a notch filter, such as notch filter 318 or notch filter 506, which attenuates frequency components of DAC input signal 1106 within frequencies $f_{chop}+/-f_B$ and harmonics thereof, $2f_{chop}+/-f_B$ and harmonics, thereof with chopping at frequency $f_{chop}=f_S/4$. The frequency and amplitude axes are not to scale, and the depiction of switched capacitor DAC 800 has been simplified to highlight points of reference in the frequency domain. Also, for clarity, FIG. 12 only depicts positive frequencies, and harmonics are not shown but are affected in the same away as their fundamental frequencies. In an audio application embodiment, the baseband of the input signal of interest from input signal source 302 has a bandwidth ranging from 0 Hz to $f_B$, where $f_B$ is about 28 kHz.

FIG. 12 depicts the effects of parasitic fold back of noise at frequencies $f_{chop}$ and $2f_{chop}$ with and without attenuation bands centered at $f_{chop}$ and $2f_{chop}$. Chopping events at reference points A, B, C, and E occur as previously described with respect to FIG. 11. As described above, nonideal properties associated with DACs, such as switched capacitor DAC 800, can result in parasitic modulation at the chopping frequency $f_{chop}$ and harmonics thereof and at $2f_{chop}$ and harmonics thereof. The parasitic modulation at frequencies $f_{chop}$ and $2f_{chop}$ cause signals having frequencies $f_{chop}+/-f_B$ and $2f_{chop}+/-f_B$ to fold into the baseband and mix with the signal of interest 1102. The frequency spectrum 1202 illustrates the fold back of quantization noise 1104 into the baseband in the absence of signal attenuation at frequencies $f_{chop}+/-f_B$ and $2f_{chop}+/-f_B$. The folded back quantization noise mixes with the signal of interest 1102 and, thus, corrupts the signal of interest 1102.

The frequency spectrum 1204 illustrates the attenuation of quantization noise 1104 between frequencies $f_{chop}+/-f_B$ and $2f_{chop}+/-f_B$ due to the presence of a notch filter, such as notch filter 318 or notch filter 506. The attenuation of quantization noise 1104 between frequencies $f_{chop}+/-f_B$ and $2f_{chop}+/-f_B$ reduces or prevents, depending on the degree of attenuation and attenuation bandwidth, fold back of quantization noise 1104 due to parasitic modulation at frequency $f_{chop}$ and $2f_{chop}$. Furthermore, notch filters can be used to attenuate noise prior to chopping at any other parasitic modulation frequency or frequencies to prevent fold back of noise into the baseband during chopping.

Thus, the signal processing system herein provides significant noise attenuation within a baseband of interest using carefully selected chopping frequencies and/or notch filters with attenuation bands around parasitic modulation frequencies.

The signal processing systems disclosed herein can be manufactured using well-known integrated, discrete, or a combination of integrated and discrete components. Additionally, software in combination with a processor can be used to implement features of the signal processing systems, such as a notch filter. Those of ordinary skill in the art will recognize that the signal processing systems disclosed herein can be implemented with a wide range of components other than those disclosed herein. For example, the digital signal modulators could be implemented using mixed signal (analog and digital) technology. Additionally, the attenuation bands of notch filters can be set to greater than, less than, or equal to $f_b$ depending on, for example, the amount of acceptable noise fold back into the baseband. Furthermore, non-ideal properties of digital signal processing systems can cause parasitic modulation at frequencies other than frequencies $f_{chop}$ and harmonics of $f_{chop}$ and $2f_{chop}$ and harmonics of $2f_{chop}$. Including notches at other parasitic modulation frequencies can reduce or prevent the fold back of noise into the baseband at these parasitic modulation frequencies as well.

Although the present invention has been described in detail, it should be understood that various changes, substitutions and alterations can be made hereto without departing from the spirit and scope of the invention as defined by the appended claims. For example, application of the signal processing systems described herein is not limited to audio applications.

What is claimed is:

1. A digital to analog converter system, comprising:
   a multi-bit digital to analog converter ("DAC") to (i) receive a digital input signal having a frequency attenuation band around a frequency $f_{chop}$, and (ii) convert the DAC input signal into a representative analog signal, the DAC comprising:
   a modulation circuit having a modulation frequency of $f_{chop}$ to modulate the DAC input signal by $f_{chop}$;
   a gain stage coupled to the modulation circuit to receive signals modulated by the modulation circuit and provide gain for the DAC, wherein during operation the gain stage is associated with noise having frequencies within the baseband; and a demodulation circuit, coupled to the gain stage and having a demodulation frequency equal to approximately or equal to $f_{chop}$, to demodulate signals by approximately or equal to $f_{chop}$; and a notch filter to generate the frequency attenuation band around the frequency $f_{chop}$ to reduce introduction of noise into a frequency baseband of the digital input signal.

2. The digital to analog converter system of claim 1 wherein the digital input signal further includes a frequency attenuation band around a frequency $2f_{chop}$, the system further comprising:

a notch filter to generate the frequency attenuation band around the frequency $2f_{chop}$ to further reduce introduction of noise into the frequency baseband of the digital input signal.

3. The digital to analog converter system of claim 1 wherein the notch filter includes a frequency attenuation band equal to or greater than the baseband and centered at approximately or equal to $f_{chop}$.

4. The digital to analog converter system of claim 1 wherein the notch filter is a digital finite impulse response filter coupled to an input of the DAC and implemented using hardware components.

5. The digital to analog converter system of claim 1 wherein the DAC comprises a switched capacitor digital to analog converter.

6. The digital to analog converter system of claim 5 wherein the switched capacitor digital to analog converter includes sampling capacitors to receive charge representative of the DAC input signal, a feed back capacitor, and switches to share charge between the sampling capacitors and the feed back capacitor.

7. The digital to analog converter system of claim 1 wherein the modulation circuit is a chopping modulator comprising series and cross-over switches to chop input signals of the gain stage, the demodulation circuit is a chopping circuit comprising series and cross-over switches to chop output signals of the gain stage, and the gain stage is a component of a fully differential amplifier.

8. The digital to analog converter system of claim 1 further comprising:

a modulator, coupled to the DAC, to receive a first digital input signal sampled at a frequency, $f_S$, to modulate the digital input signal, wherein the first digital input signal includes frequency components residing within the baseband bounded by frequencies $f_1$ and $f_2$ and wherein a byproduct of the first digital input signal modulation includes quantization noise having frequency components residing outside of the baseband, wherein the input signal of the DAC is derived from the modulated first digital input signal.

9. The digital to analog converter system of claim 8 wherein the notch filter is implemented within the modulator.

10. The digital to analog converter system of claim 8 wherein the modulator is a delta sigma modulator and the notch filter is implemented within an internal feedback path of the delta sigma modulator.

11. The digital to analog converter system of claim 8 wherein $f_1$ and $f_2$ define respective high and low frequencies of an audio signal baseband.

12. The digital to analog converter system of claim 10 wherein $f_1=0$ Hz and $f_2=25$ kHz.

13. A method to attenuate chopping noise of a digital to analog converter within a frequency baseband of an input signal, wherein the chopping noise is associated with a chopping circuit having a chopping frequency of $f_{chop}$, the method comprising:

attenuating noise signal components of an input signal modulated by a multi-bit digital to analog converter prior to chopping over an attenuation band at least equal to the baseband of the input signal and centered at $f_{chop}$, wherein $f_{chop}$ is greater than a highest frequency of the baseband of the input signal.

14. The method as in claim 13 further comprising:

attenuating noise signal components of the input signal prior to chopping over an attenuation band at least equal to the baseband of the input signal and centered at $2f_{chop}$.

15. The method as in claim 13 wherein attenuating signal components comprises:

filtering the digital input signal using a digital finite input response notch filter.

16. The method as in claim 13 further comprising:

modulating the digital input signal comprises modulating the digital input signal using a delta sigma modulator; and wherein attenuating signal components comprises filtering the modulated digital signal further comprises filtering the modulated digital input signal within a feedback loop of the delta sigma modulator.

17. The method as in claim 13 wherein the digital input signal is an audio signal.

18. A method to attenuate chopping noise of a digital to analog converter within a frequency baseband of an input signal, wherein the chopping noise is associated with a chopping circuit having a chopping frequency of $f_{chop}$, the method comprising:

attenuating noise signal components of a digital input signal within a loop of a delta-sigma modulator prior to chopping over an attenuation band at least equal to the baseband of the input signal and centered at $f_{chop}$, wherein $f_{chop}$ is greater than a highest frequency of the baseband of the input signal to reduce introduction of noise into a frequency baseband of the digital input signal.

19. The method as in claim 18 further comprising:

attenuating noise signal components of a digital input signal within a loop of the delta-sigma modulator prior to chopping over an attenuation band at least equal to the baseband of the input signal and centered at $2f_{chop}$ to further reduce introduction of noise into a frequency baseband of the digital input signal.

20. An audio system comprising:

a digital audio signal source;

a digital to analog converter ("DAC") to (i) receive a digital input signal from the digital audio signal source having a frequency attenuation band around a frequency $f_{chop}$, and (ii) convert the DAC input signal into a representative analog signal, the DAC comprising:

a delta-sigma modulator having a notch filter within the delta-sigma modulator to generate the frequency attenuation band around the frequency $f_{chop}$ to reduce introduction of noise into a frequency baseband of the digital input signal;

a modulation circuit having a modulation frequency of $f_{chop}$ to modulate the DAC input signal by $f_{chop}$;

a gain stage coupled to the first modulation circuit to receive signals modulated by the modulation circuit and provide gain for the DAC, wherein during operation the gain stage is associated with noise having frequencies within the baseband; and a demodulation circuit, coupled to the gain stage and having a demodulation frequency equal to approximately or equal to $f_{chop}$, to demodulate signals by approximately or equal to $f_{chop}$;

an amplifier coupled to the DAC; and an audio output device coupled to the DAC.

21. The audio system of claim 20 wherein the digital input signal further includes a frequency attenuation band around a frequency $2f_{chop}$, the system further comprising:

a second notch filter within the delta-sigma modulator to generate the frequency attenuation band around the frequency $2f_{chop}$ to further reduce introduction of noise into the frequency baseband of the digital input signal.

22. The audio system of claim 20 wherein the modulation circuit is a chopping modulator comprising series and cross-over switches to chop input signals of the gain stage, the demodulation circuit is a chopping circuit comprising series and cross-over switches to chop output signals of the gain stage, and the gain stage is a component of a fully differential amplifier.

23. The audio system of claim 20 wherein the notch filter includes a frequency attenuation band equal to or greater than the baseband and centered at approximately or equal to $f_{chop}$.

24. The audio system of claim 20 wherein the notch filter is a digital finite impulse response filter.

* * * * *

UNITED STATES PATENT AND TRADEMARK OFFICE
CERTIFICATE OF CORRECTION

PATENT NO. : 6,861,968 B2
DATED : March 1, 2005
INVENTOR(S) : John L. Melanson, Stephen T. Hodapp and Giri N.K. Rangan It is certified that error appears in the above-identified patent and that said Letters Patent is hereby corrected as shown below:

Column 2,
Line 41, "Ins." should be -- lns. --
Line 54, "ADCS" should be -- ADCs --

Column 4,
Line 5, "sigmna" should be -- sigma --

Column 8,
Line 29, "$0 \leqq i \leqq N-1$" should be -- $0 \leq i \leq N-1$ --

Column 11,
Line 19, "offs" should be -- of $f_S$ --

Signed and Sealed this

Thirty-first Day of May, 2005

JON W. DUDAS
*Director of the United States Patent and Trademark Office*